United States Patent [19]
Ariie et al.

[11] Patent Number: 5,717,364
[45] Date of Patent: Feb. 10, 1998

[54] MIXER

[75] Inventors: Mitsuo Ariie, Nagaokakyo; Hiroaki Tanaka, Osaka-fu, both of Japan

[73] Assignee: Murata Manufacturing Co. Ltd., Japan

[21] Appl. No.: 734,468

[22] Filed: Oct. 17, 1996

[30] Foreign Application Priority Data

Oct. 18, 1995 [JP] Japan ................... 7-270027

[51] Int. Cl.$^6$ ............... H03B 21/00; H03C 3/00; H04B 1/28
[52] U.S. Cl. ............... 332/135; 332/146; 332/178; 327/119; 331/42; 455/333
[58] Field of Search .................. 332/135, 136, 332/146, 157, 168, 178; 327/113, 119; 330/147, 277; 331/42, 43; 455/333

[56] References Cited

U.S. PATENT DOCUMENTS 5,263,198  11/1993  Geddes et al. ................ 455/325
5,325,000  6/1994   Birkeland et al. ............. 331/42 X

FOREIGN PATENT DOCUMENTS 1152278  5/1969  United Kingdom.

OTHER PUBLICATIONS

"Low Power Quadrature Modulator IC's for Digital Mobile Communications", by Yasushi Yamao and Shigeki Saito, Society of Electro Information and Communication, C–I, vol. J76–C–1 No. 11, pp. 453–461, Nov. 1993.

*Primary Examiner*—David Mis
*Attorney, Agent, or Firm*—Ostrolenk, Faber, Gerb & Soffen, LLP

[57] ABSTRACT

A small and inexpensive mixer that does not require a choke inductor and a large-capacitance capacitor. The mixer has a FET. The FET's source is grounded via a capacitor and is also connected to a power-supply terminal. The FET's gate is coupled to a bias voltage and also connected to a gate input terminal via a capacitor. The FET's drain is connected to an output terminal via a capacitor. A modulating signal is input into the power-supply terminal, and a local signal is input into the gate input terminal, so that a modulated signal is output from the output terminal.

5 Claims, 3 Drawing Sheets

MIXER

BACKGROUND OF THE INVENTION

1. Field of the Invention

The present invention relates generally to a mixer for use in a modulator, a demodulator or the like. In particular, the invention relates to a mixer for use in the digital modulation/demodulation operation.

2. Description of the Related Art

A typical known type of mixer circuit is shown in FIG. 4. The FET's gate is connected to a gate input terminal IN via a coupling capacitor C1, and a bias voltage Vg is applied to the FET's gate via a resistor R1. The FET's source is grounded through a parallel circuit of a capacitor C21 having a large capacitance of several µF and a capacitor C22 having a small capacitance of several pF. The FET's drain is coupled to a power-supply terminal $T_{vcc}$ via a choke inductor L and is also connected to an output terminal OUT via a coupling capacitor C3. The capacitor C21 has a large capacitance in order to cause a modulating signal fm at a low frequency to be grounded, while the capacitor C22 has a small capacitance in order to cause a local signal fc at a high frequency to be grounded. The inductance of the inductor L is so determined as to exhibit a high exhibit with respect to a modulated signal (fc±fm) and to exert a low impedance with respect to the modulating signal fm. The capacitance of the capacitor C3 connected to the FET's drain is so determined as to present a low impedance with respect to the modulated signal (fc±fm) and to exhibit a high impedance with respect to the modulating signal fm.

The operation of the above-described mixer circuit will now be explained. The modulating signal fm is input into the power-supply terminal $T_{vcc}$ while being superimposed on the power-supply voltage Vcc of the terminal $T_{vcc}$. A local signal fc is input into the FET's gate from the gate input terminal IN while being superimposed on the bias voltage Vg. As a result, the modulated signal (fc±fm) is output from the output terminal OUT via the capacitor C3.

FIG. 5 illustrates a balanced mixer circuit that is constructed of a pair of mixer circuits shown in FIG. 4 in a balanced manner. More specifically, the FET of one mixer circuit is referred to as FET1, while the FET of the other mixer circuit is referred to as FET2. The output terminals OUT of FET1 and FET2 are interconnected to each other, and the bias voltage Vg and the capacitors C21 and C22 are in common use. In operation, the modulating signal fm and the local signal fc of the FET2 are 180° out of phase with the corresponding signals of the FET1, and are input so as to reduce the even-number harmonics of the modulating signal fm.

However, in this circuit, the FET's drain is used in common for the input of a modulating signal and the output of a modulated signal. Thus, when the mixer of the above conventional type is formed into an IC, a choke inductor L is required to prevent the leakage of the modulated signal (fc±fm) to the power-supply terminal $T_{vcc}$, thereby enlarging the area of the IC chip. Further, a large-capacitance capacitor C21 is required to cause the modulating signal fm at a low frequency to be grounded, thereby increasing the cost.

SUMMARY OF THE INVENTION

Accordingly, it is an object of the present invention to provide a small and inexpensive mixer that does not require a choke inductor and a large-capacitance capacitor.

In order to achieve the above object, according to the present invention, there is provided a mixer device comprising at least one mixer having a field-effect transistor (FET). The FET's source is grounded via a capacitor (C2) and is also connected to a power-supply terminal ($T_{vcc}$). The FET's gate is connected to a bias voltage (Vg) and is also connected to a gate input terminal (IN) via a capacitor (C1). The FET's drain is connected to an output terminal (OUT) via a capacitor. A modulating signal (fm) is input from the power-supply terminal while being superimposed on a DC voltage, and a local signal (fc) is input into the gate input terminal (IN), so that a modulated signal (fc±fm) can be output from the output terminal (OUT).

In the mixer circuit of the present invention, the FET's drain (or source) is not used in common for the input of a modulating signal and the output of a modulated signal. This eliminates the need for the provision of a choke inductor for preventing the leakage of a modulated signal to a modulating signal input terminal, thereby reducing the area of an IC chip formed by the circuit and also decreasing its size and cost.

Moreover, a large-capacitance capacitor is conventionally required between the source (or drain) and a ground, to ground a modulating signal input from the drain (or source) to the source (or drain). In the present invention, however, a modulating signal is input from the source (or drain), and unlike a capacitor used in the conventional circuit, a capacitor coupled between the source (or drain) and a ground is used for preventing leakage of the modulating signal to ground, thereby only requiring a small-capacitance capacitor.

In the aforedescribed mixer device, mixing is performed in such a manner that the three terminals of the FET, i.e., the FET's gate, source and drain, are assigned to the operations of the local signal input, the modulating signal input, and the modulated signal output, respectively. This eliminates the need for the provision of an inductor for preventing the leakage of a modulated signal. A DC path can be interrupted by the capacitor, thereby avoiding the flowing of the DC current between the FET's source and drain.

Moreover, a pair of the above-described mixers may be used to form a balanced mixer device in which the FETs' drains are interconnected to each other in a balanced manner, so that a synthesized signal (fc±fm) of the modulated signals obtained in the respective mixers can be output. Since this balanced mixer device is constructed in a balanced manner, the frequency component having the odd number of n+m can be reduced when the modulated signal is represented by (n·fc±m·fm), and n and m indicate positive integers.

Further, a DC path can be interrupted by the capacitor so as to avoid a DC current flowing between the FET's drain and source, thereby totally eliminating power consumption. Additionally, a single mixer constructed in a balanced manner is advantageous over a balanced mixer formed simply by a combination of two discrete mixers because there can be a decrease in the capacitance and the area of an IC chip.

The present invention also provides a mixer device comprising at least one mixer having a field-effect transistor (FET), the FET's drain grounded via a capacitor (C2) and also connected to a power-supply terminal ($T_{vcc}$), the FET's gate connected to a bias voltage (Vg) and also connected to a gate input terminal (IN) via a capacitor (C1), and the FET's source connected to an output terminal (OUT) via a capacitor. A modulating signal (fm) is input from the power-supply terminal while being superimposed on a DC voltage, and a local signal (fc) is input into the gate input terminal (IN), so that a modulated signal (fc±fm) can be output from the output terminal (OUT). Further, a pair of the above-described mixers may be used to form a balanced mixer device in which the FETs' sources are interconnected to each other in a balanced manner, so that a synthesized signal (fc±fm) of the modulated signals obtained in the respective mixers can be output.

This mixer device offers advantages similar to those obtained by the foregoing mixer device.

DESCRIPTION OF PREFERRED EMBODIMENTS

Figure 1:
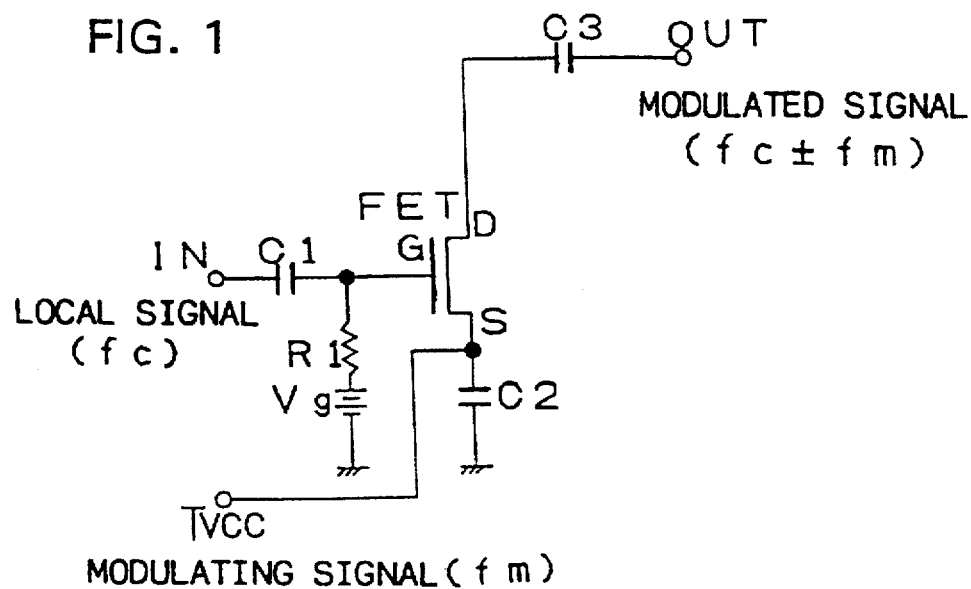
FIG. 1 is a circuit diagram of a mixer according to a first embodiment of the present invention.

A mixer circuit according to a first embodiment of the present invention will now be described with reference to FIG. 1. Referring to FIG. 1, the FET's gate is connected to a gate input terminal IN through a coupling capacitor C1, and a bias voltage Vg is applied to the FET's gate via a resistor R1. The FET's source is grounded via a by-pass capacitor C2 and is also connected to a power-supply terminal $T_{vcc}$. The FET's drain is coupled to an output terminal OUT via a coupling capacitor C3.

An explanation will now be given of the operation of the above-described mixer circuit. A modulating signal fm is input into the terminal $T_{vcc}$ while being superimposed on the DC voltage VCC of the terminal $T_{vcc}$. On the other hand, a local signal fc is input into the FET's gate from the gate input terminal IN while being superimposed on the bias voltage Vg. Then, the modulated signal (fc±fm) is output from the output terminal OUT.

The capacitance of the capacitor C2 coupled to the FET's source is so determined as to exhibit a low impedance with respect to the local signal fc and to present a high impedance with respect to the modulating signal fm. On the other hand, the capacitance of the capacitor C3 connected to the FET's drain is so determined as to exhibit a low impedance with respect to the modulated signal (fc±fm) and to present a high impedance with respect to the modulating signal fm. It should be noted that the FET's drain and source are exchangeable in the mixer circuit shown in FIG. 1.

In the circuit of this embodiment, the capacitors C2 and C3 serve to interrupt a DC path so as to prevent the flowing of the DC current between the FET's source and drain, thereby completely eliminating power consumption. Further, an inductor is not required for preventing the leakage of the modulated signal (fc±fm), thereby decreasing the area of an IC chip formed by this circuit. Additionally, the modulating signal fm is input from the FET's source, thereby obviating the need for the provision of a large-capacitance capacitor.

A description will now be given of a balanced mixer circuit according to a second embodiment of the present invention with reference to FIG. 2. In this embodiment, a pair of mixer circuits of the first embodiment are combined in a balanced manner so as to form a balanced mixer circuit. More specifically, the FET of one mixer circuit is FET1, while the FET of the other mixer circuit is FET2. FET1's drain and FET2's drain are interconnected to each other, and the bias voltage Vg and the capacitor C3 are in common use. It should be noted that the drain and source of FET1 and FET2 are exchangeable in the circuit shown in FIG. 2.

The operation of this embodiment will now be explained. A modulating signal (0°) is applied to the power-supply terminal $T_{vcc}$ of FET1 while being superimposed on the DC voltage VCC of the terminal $T_{vcc}$. Similarly, a modulating signal (180°) is applied to the power-supply terminal $T_{vcc}$ of FET2 while being superimposed on the DC voltage VCC of the terminal $T_{vcc}$. Moreover, a local signal (0°) is input into the gate input terminal IN of FET1 while being superimposed on the bias voltage Vg. On the other hand, a local signal (180°) is input into the gate input terminal IN of FET2 while being superimposed on the bias voltage Vg. As a consequence, the modulated signal (fc±fm) obtained by modulating the local signals fc and the modulating signals fm in the respective FET1 and FET2 and synthesizing the modulated signals is output from the output terminal OUT.

In this case, the capacitances of the capacitors C2 coupled to FET1's source and FET2's source, respectively, are so selected as to exhibit a low impedance with respect to the local signals fc and to exhibit a high impedance with respect to the modulating signals fm. On the other hand, the capacitance of the capacitor C3 coupled to FET1's drain and FET2's drain is so determined as to present a low impedance with respect to the modulated signal (fc±fm) and to exhibit a high impedance with respect to the modulating signals fm.

As described above, the mixer circuit of this embodiment is constructed in a balanced manner. Accordingly, when the modulated signal is represented by (n·fc±m·fm), and n and m indicate integers, the frequency component having the odd numbers of n+m can be decreased. Also, this circuit is an improvement over a balanced mixer circuit formed merely by a combination of two discrete mixer circuits of the first embodiment because it can reduce the capacitance and the area of an IC chip formed by this circuit.

Figure 2:
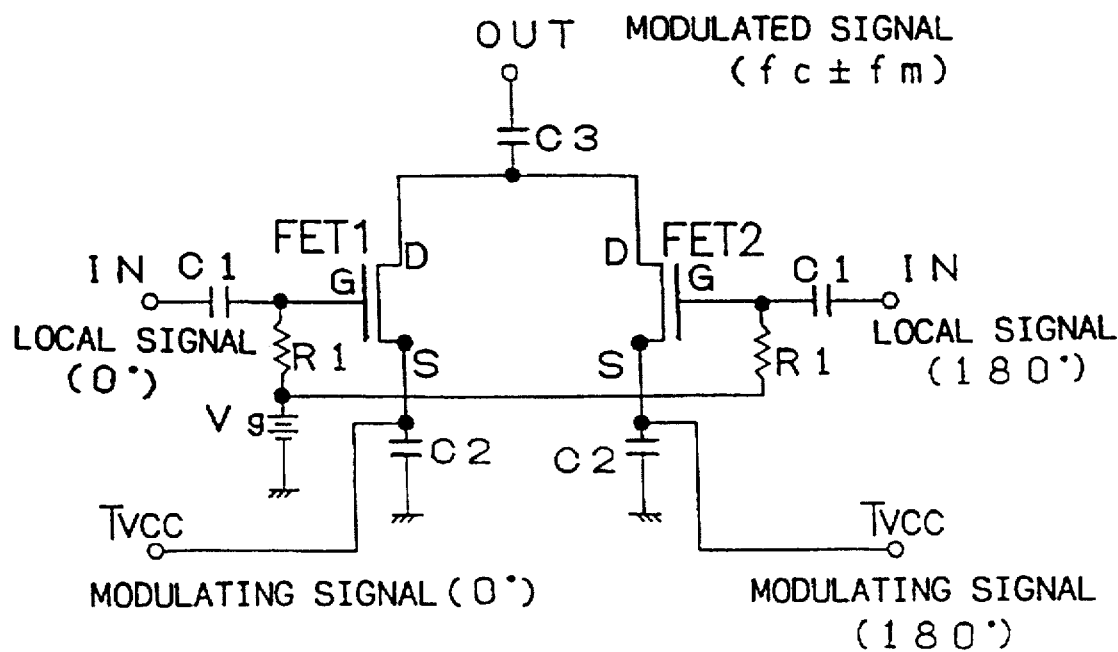
FIG. 2 is a circuit diagram of a balanced mixer according to a second embodiment of the present invention.
Figure 3:
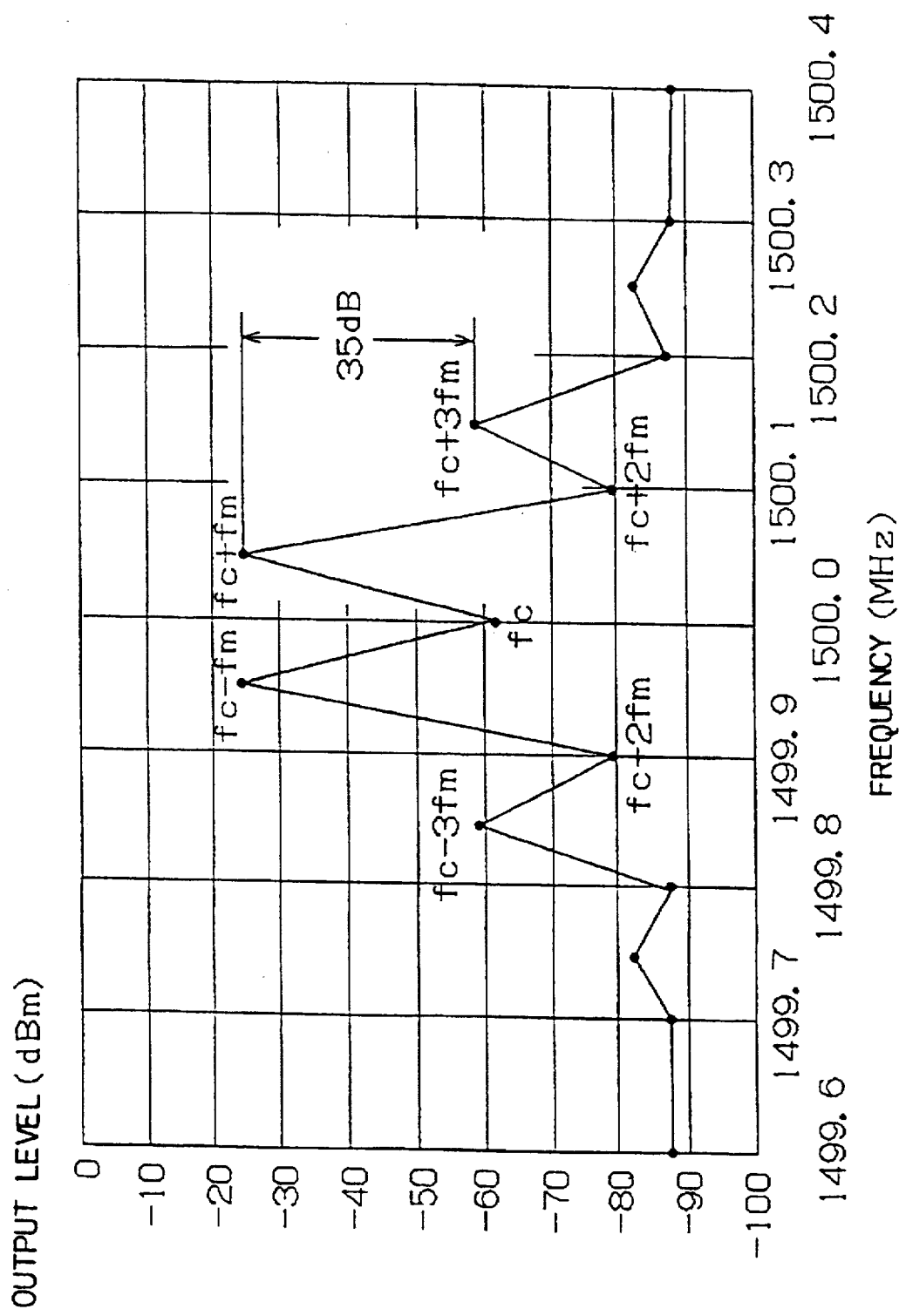
FIG. 3 is a diagram of the output characteristics of the circuit shown in FIG. 2 with respect to the frequency.
Figure 4:
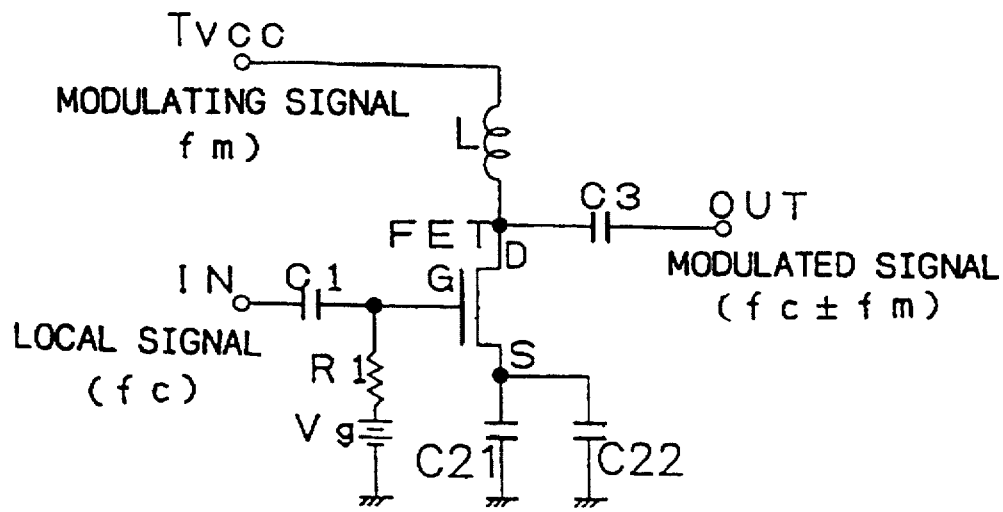
FIG. 4 is a circuit diagram of a known mixer.
Figure 5:
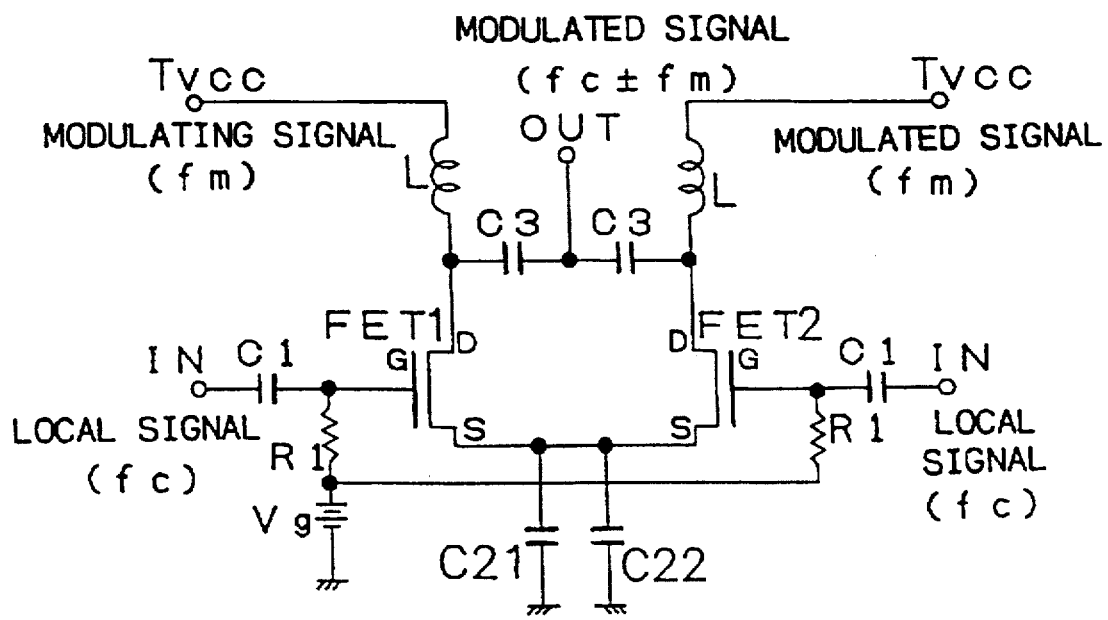
FIG. 5 is a circuit diagram of a known balanced mixer.

FIG. 3 shows the output characteristics of the circuit of the second embodiment shown in FIG. 2 with respect to the frequency when the circuit was tested under the conditions shown in Table 1.

TABLE 1

| Item | Value |
| --- | --- |
| C1, C2, C3 | 12 pF |
| R1 | 1 kΩ |
| power-supply voltage (Vcc) | 3.0 V |
| gate voltage (Vg) | 2.7 V |
| frequency of local signal fc | 1500 MHz |
| level of local signal fc | −10 dBm |
| phase difference of local signal fc | 180 deg |
| frequency of modulating signal fm | 50 kHz |
| voltage amplitude of modulating signal fm | 300 mV |
| phase difference of modulating signal fm | 180 deg |

FIG. 3 reveals that a difference between the desired modulated signal (fc±fm) and the highest level of the unwanted signals (fc±3 fm) is 35 dB or greater. Thus, good output characteristics were obtained with the mixer circuit shown in FIG. 2.

Although the present invention has been described in relation to particular embodiments thereof, many other variations and modifications and other uses will become apparent to those skilled in the art. Therefore, the present invention is not limited by the specific disclosure herein.

What is claimed is:

1. A mixer circuit comprising:

a field-effect transistor (FET) having a gate, a source and a drain;

one of the source and drain being grounded via a capacitor and also connected to a power-supply terminal;

the gate being connected to a bias voltage and also connected to a gate input terminal via a capacitor; and the other of the source and drain being connected to an output terminal via a capacitor;

said circuit being operable for receiving a modulating signal at said power-supply terminal, said modulating signal being superimposed on a power-supply voltage, and receiving a local signal at said gate input terminal, and outputing a modulated signal from said output terminal.

2. A mixer circuit as claimed in claim 1, wherein said one of said source and drain is the source of the FET, and said other of said source and drain is the drain of the FET.

3. A balanced mixer circuit comprising:

a pair of mixer circuits interconnected in a balanced manner, each said mixer circuit comprising:

a field-effect transistor (FET) having a gate, a source and a drain;

one of the source and drain being grounded via a capacitor and also connected to a power-supply terminal;

the gate being connected to a bias voltage and also connected to a gate input terminal via a capacitor; and the other of the source and drain being connected to an output terminal via a capacitor;

said circuit being operable for receiving a modulating signal at said power-supply terminal, said modulating signal being superimposed on a power-supply voltage, and receiving a local signal at said gate input terminal, and outputing a modulated signal from said output terminal;

the other of the source and drain of each said FET being interconnected and connected in common to said capacitor, to each other in a balanced manner, so as to output a synthesized signal which comprises the respective modulated signals of each of the pair of mixer circuits.

4. A balanced mixer circuit as claimed in claim 3, wherein said one of said source and drain in each respective FET is the source of the corresponding FET, and said other of said source and drain in each respective FET is the drain of the corresponding FET.

5. A mixer circuit comprising:

a field-effect transistor (FET) having a gate, a source and a drain;

one of the source and drain being connected to a power-supply terminal;

the gate being connected to a gate input terminal; and the other of the source and drain being connected to an output terminal;

said circuit being operable for receiving a modulating signal at said power-supply terminal, said modulating signal being superimposed on a power-supply voltage, and receiving a local signal at said gate input terminal, and outputting a modulated signal from said output terminal;

wherein said one of the source and drain is further connected to ground by a capacitor.

* * * * *